US009058457B2

(12) United States Patent
Greco et al.

(10) Patent No.: US 9,058,457 B2
(45) Date of Patent: Jun. 16, 2015

(54) RETICLE DATA DECOMPOSITION FOR FOCAL PLANE DETERMINATION IN LITHOGRAPHIC PROCESSES

(71) Applicant: International Business Machines Corporation, Armonk, NY (US)

(72) Inventors: Stephen E. Greco, Lagrangeville, NY (US); Ian P. Stobert, Hopewell Junction, NY (US); Rasit O. Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/083,578

(22) Filed: Nov. 19, 2013

(65) Prior Publication Data
US 2015/0143305 A1    May 21, 2015

(51) Int. Cl.
*G06F 17/50*    (2006.01)
*H01L 21/66*    (2006.01)

(52) U.S. Cl.
CPC ............ *G06F 17/5068* (2013.01); *H01L 22/12* (2013.01); *H01L 22/20* (2013.01)

(58) Field of Classification Search
CPC . G03F 7/70433; G03F 7/705; G03F 7/70641; G03F 9/7026
USPC ...................................................... 716/52, 54
See application file for complete search history.

(56) References Cited

U.S. PATENT DOCUMENTS

| 7,814,456 | B2 | 10/2010 | Gupta et al. | |
| 8,404,403 | B2 | 3/2013 | Ogadhoh et al. | |
| 2003/0084918 | A1* | 5/2003 | Kim | 134/1.2 |
| 2004/0058255 | A1 | 3/2004 | Jessen et al. | |
| 2008/0180656 | A1* | 7/2008 | Meeks et al. | 356/73 |
| 2012/0194792 | A1* | 8/2012 | Sapp et al. | 355/55 |
| 2012/0254812 | A1* | 10/2012 | Brunner et al. | 716/52 |

OTHER PUBLICATIONS

Liegl et al., "Predicting substrate-induced focus error", J. Micro/Nanolith. MEMS MOEMS. 9(4), pp. 041311-1 to 041311-9, (Oct.-Dec. 2010) http://nanolithography.spiedigitallibrary.org/ on Jun. 26, 2013 Terms of Use: http://spiedl.org/terms.
Gupta et al., "Wafer Topography-Aware Optical Proximity Correction." IEEE Transactions on Computer-Aided Design of Integrated Circuits and Systems, vol. 25, No. 12, pp. 2747-2756 Dec. 2006.

(Continued)

*Primary Examiner* — Vuthe Siek
*Assistant Examiner* — Aric Lin
(74) *Attorney, Agent, or Firm* — Keivan Razavi; Yuanmin Cai

(57) ABSTRACT

A method of determining focal planes during a photolithographic exposure of a wafer surface is provided. The method may include receiving data corresponding to a surface topography of the wafer surface and determining, based on the received data corresponding to the surface topography, a plurality of regions having substantially different topographies. Reticle design data is received for exposure on the wafer surface, whereby, from the received reticle design data, reticle design data subsets that are each allocated to a corresponding one of the determined plurality of regions are generated. A best fit focal plane is then generated for each of the determined plurality of regions.

17 Claims, 8 Drawing Sheets

(56) References Cited

OTHER PUBLICATIONS

Oh et al., "Full-Chip Correction of Implant Layer Accounting for underlying topography.", Proc. of SPIE vol. 8326, pp. 8326R-1 to 8326R-8, Optical Microlithography XXV, edited by Will Conley, 2012 SPIE CCC code: 0277-786X/12$18, doi10.1117/12.917984, http://spiedigitallibrary.org/ on Jun. 27, 2013 Terms of Use: http://spiedl.org/terms.

Voznesenskiy et al., "Large Scale Model of Wafer Topography Effects.", Proc. of SPIE vol. 7973, Optical Microlithography XXIV, edited by Mircea V. Dusa, 2011 SPIE CCC code 0277-786X/11/$18, doi:10.1117/12.879605 pp. 79732G-1 to 79732G-8, 2011, http://proceedings.spiedigitallibrary.org/ on Jun. 27, 2013 Terms of Use: http://spiedl.org/terms.

Shao et al., "Substrate Aware OPC Rules for Edge Effect in Block Levels.", Proc. of SPIE vol. 7823, pp. 7823U-1 to 9, Photomask Technology 2010, edited by M. Warren Montgomery, Wilhelm Maurer, 2010 SPIE, CCC code: 0277-786X/10$18, doi:1117/12.865134, http://proceedings.spiedigitallibrary.org/ on Jul. 2, 2013 Terms of Use: http://spiedl.org/terms.

Melvin et al.,"The Use of Optical Proximity Correction to compensate for reflectivity differences in N type and P type Poly-silicon", Proc. of SPIE vol. 6156, pp. 61561F-1 to 61561F-7, (2006) 0277-786X/06/$15, doi:10.1117/12.656732, Design and Process Integration for Microelectronic Manufacturing IV, edited by Alfred K. K. Wong, Vivek K. Singh, http://proceedings.spiedigitallibrary.org/ on Jul. 3, 2013 Terms of Use: http://spiedl.org/terms.

\* cited by examiner

RETICLE DATA DECOMPOSITION FOR FOCAL PLANE DETERMINATION IN LITHOGRAPHIC PROCESSES

BACKGROUND a. Field of the Invention

The present invention generally relates to semiconductor manufacturing, and more particularly to focal plane determination in lithographic processes.

b. Background of Invention

As semiconductor groundrules shrink, efforts may be made to enable the use of current generation lithography tools (e.g., high NA 193 nm immersion) for technology nodes below, for example, 20 nm or 22 nm. These efforts may, among other things, be a function of the need to reduce lithography costs and manufacturing delays associated with advancing new lithography tools.

One factor that may contribute to limiting the capabilities of advanced lithography tools is depth of focus. There are various factors which contribute to focus variability when a wafer is being exposed during a lithographic process. A significant factor associated with the advent of focus variability is the field wafer topography. For example, back-end-of-the-line (BEOL) copper (Cu) chemical mechanical polishing (CMP) processes may contribute to generating surface topography variations on each metal layer within a reticle field (e.g., exposure area of a wafer or chip).

A surface topography variation on a BEOL metal layer within the reticle field may depend on geometric design parameters such as, for example, local metal pattern densities, electrical connection linewidths, and shape perimeter densities at both the level of the CMP and at underlying metal levels. In other words, the CMP process applied to the BEOL metal layer may create a 3-dimensional (3D) topography on the metal layer rather than a planar surface. Moreover, as new metal layers are fabricated and polished using CMP, the 3D topography of the underlying metal layers also contributes to the topography variations of each new fabricated layer.

BRIEF SUMMARY

According to one or more embodiments, it may be advantageous, among other things, to decompose (i.e., split) reticle data into at least two data sets in order to determine a focal plane for each individual one of the at least two data sets (i.e., subsets) and, thus, achieve better average focus (i.e., a reduced non-correctable error) across a reticle field.

According to at least one exemplary embodiment, a method of determining focal planes during a photolithographic exposure of a wafer surface is provided. The method may include receiving data corresponding to a surface topography of the wafer surface and determining, based on the received data corresponding to the surface topography, a plurality of regions having substantially different topographies. Reticle design data is received for exposure on the wafer surface, whereby, from the received reticle design data, reticle design data subsets that are each allocated to a corresponding one of the determined plurality of regions are generated. A best fit focal plane is then generated for each of the determined plurality of regions.

According to at least one other exemplary embodiment, a computer program product for determining focal planes during a photolithographic exposure of a wafer surface is provided. The computer program product includes a computer readable storage medium readable by a processing circuit and stores instructions for execution by the processing circuit for performing a method. The performed method may include receiving data corresponding to a surface topography of the wafer surface and determining, based on the received data corresponding to the surface topography, a plurality of regions having substantially different topographies. Reticle design data is received for exposure on the wafer surface, whereby, from the received reticle design data, reticle design data subsets that are each allocated to a corresponding one of the determined plurality of regions are generated. A best fit focal plane is then generated for each of the determined plurality of regions.

According to yet another exemplary embodiment, a computer system for determining focal planes during a photolithographic exposure of a wafer surface may include a memory and a processor in communication with the memory, whereby the processor includes an instruction fetching unit for fetching instructions from memory and one or more execution units for executing fetched instructions. The computer system may be capable of performing a method including receiving data corresponding to a surface topography of the wafer surface and determining, based on the received data corresponding to the surface topography, a plurality of regions having substantially different topographies. Reticle design data is received for exposure on the wafer surface, whereby, from the received reticle design data, reticle design data subsets that are each allocated to a corresponding one of the determined plurality of regions are generated. A best fit focal plane is then generated for each of the determined plurality of regions.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
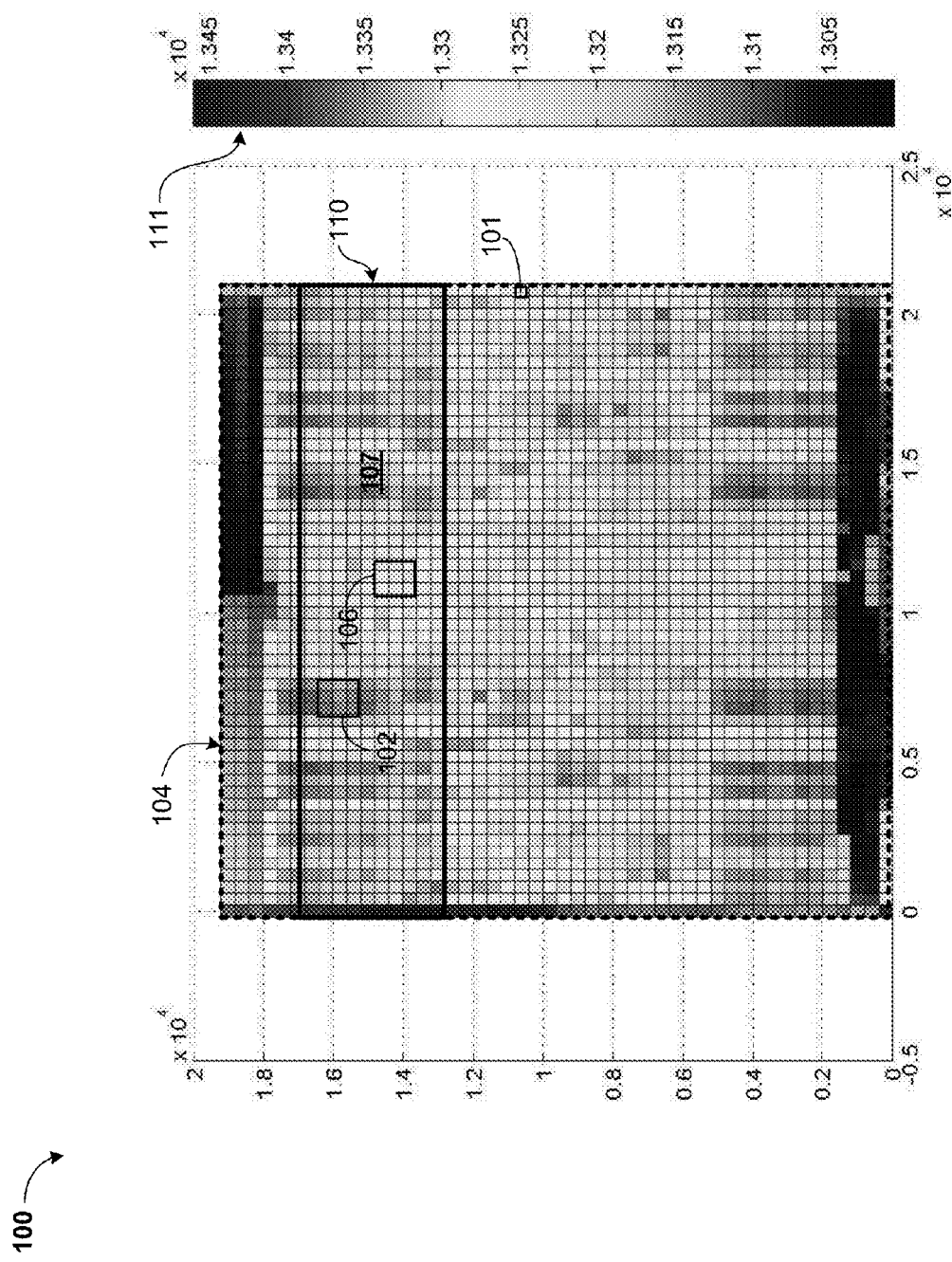
FIG. 1A is a 3-dimensional (3D) topography map for the surface of a region of a reticle, according to one embodiment.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The following one or more exemplary embodiments describe the processing of reticle data in order to enhance focal plane selection during photolithographic processes. The plane of exposure of a lithographic tool would typically be set to coincide with the surface plane of the wafer area being exposed (i.e., reticle field). However, based on variations in the surface topography of the wafer, a fixed focal plane may be defocused relative to certain points on the wafer surface. Accordingly, the following one or more embodiments describe decomposing or splitting reticle data into reticle data groups. Each of the reticle data groups is then assigned a different focal plane setting to achieve better average focus across the reticle field.

Referring to FIG. 1A, since the CMP induced topography of, for example, a fabricated BEOL metal layer can be modeled, a 3D contour 100 of the expected surface height after CMP may be generated. For example, as depicted in region 102 of the reticle field 104 (e.g., wafer area or chip area), the darker region tiles may be representative of a surface topography of increased height compared to region 106, which includes lighter colored tiles.

A lithography tool generally exposes a reticle field by scanning a slit of fixed width (e.g., 8 mm) from one end of the reticle field to the other. Alternatively, the slit may be fixed in position while the wafer is moved. As the slit scans across the reticle field (e.g., wafer or chip area), the lithography tool exposes the slit in a focal plane, and chooses the best possible instantaneous exposure plane. Referring to FIG. 1A, for example, as slit 110 moves across the reticle field 104, the modeled 3D topography of region 102 may indicate a greater height at region 102 relative to region 106. Thus, the lithography tool may choose the best possible instantaneous exposure plane (i.e., focal plane) based on the height differences between region 102 and 104.

Figure 1B:
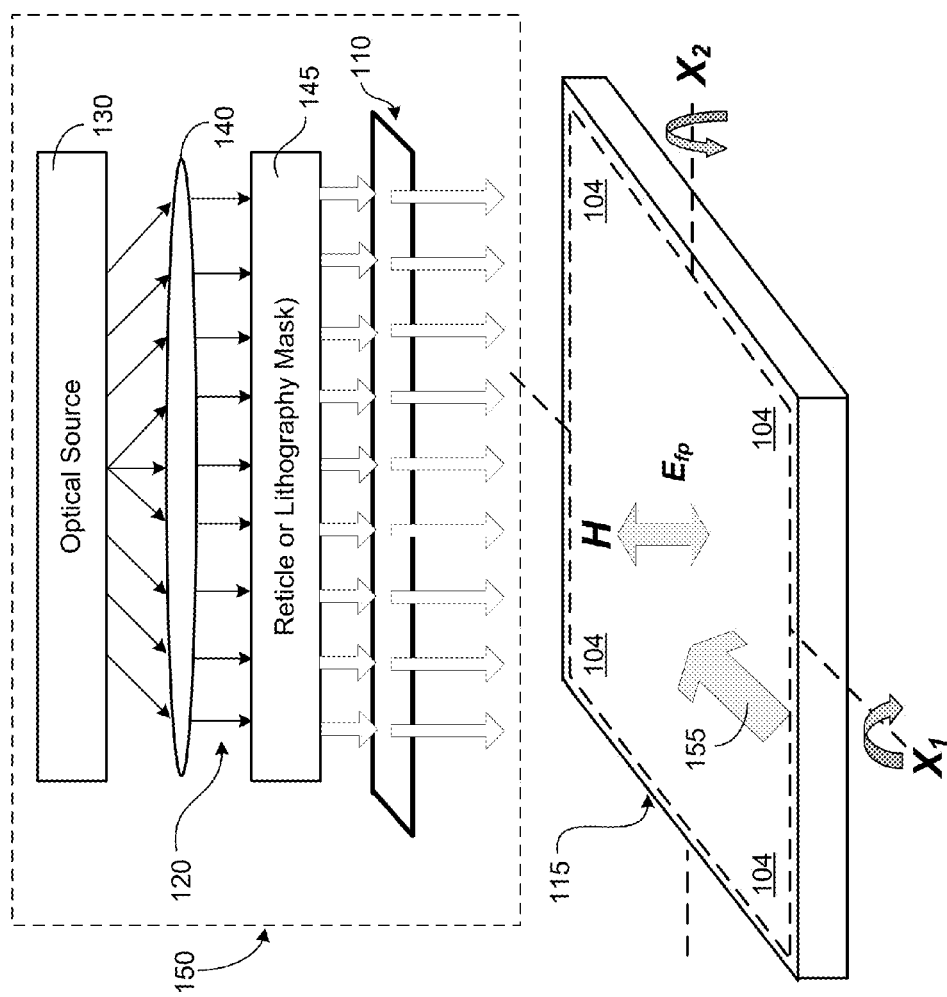
FIG. 1B is a simplified schematic representation of photolithography tool, according to one embodiment.

Referring to FIG. 1B, in operation, based on the topography across the reticle field 104, the exposure focal plane $E_{fp}$ (depicted by dashed area) may be varied by three-dimensionally adjusting a wafer 115 orientation according to height (H), a first tilt axis ($X_1$), and a second tilt axis ($X_2$) relative to a collimated illumination signal 120 that is generated by an optical source 130 and condenser lens 140 of lithography tool 150. As further depicted, the collimated illumination signal 120 propagates through the mask or reticle 145, through slit 110, and then onto reticle field 104 of the wafer 115. Selecting the focal plane $E_{fp}$ having a best-fit focal plane relative to the surface topography of wafer 115 is further explained with the aid of FIG. 2, whereby a graph 200 illustrating the wafer's 115 surface topography is depicted as a function of height (H) across the reticle field 201.

Figure 2:
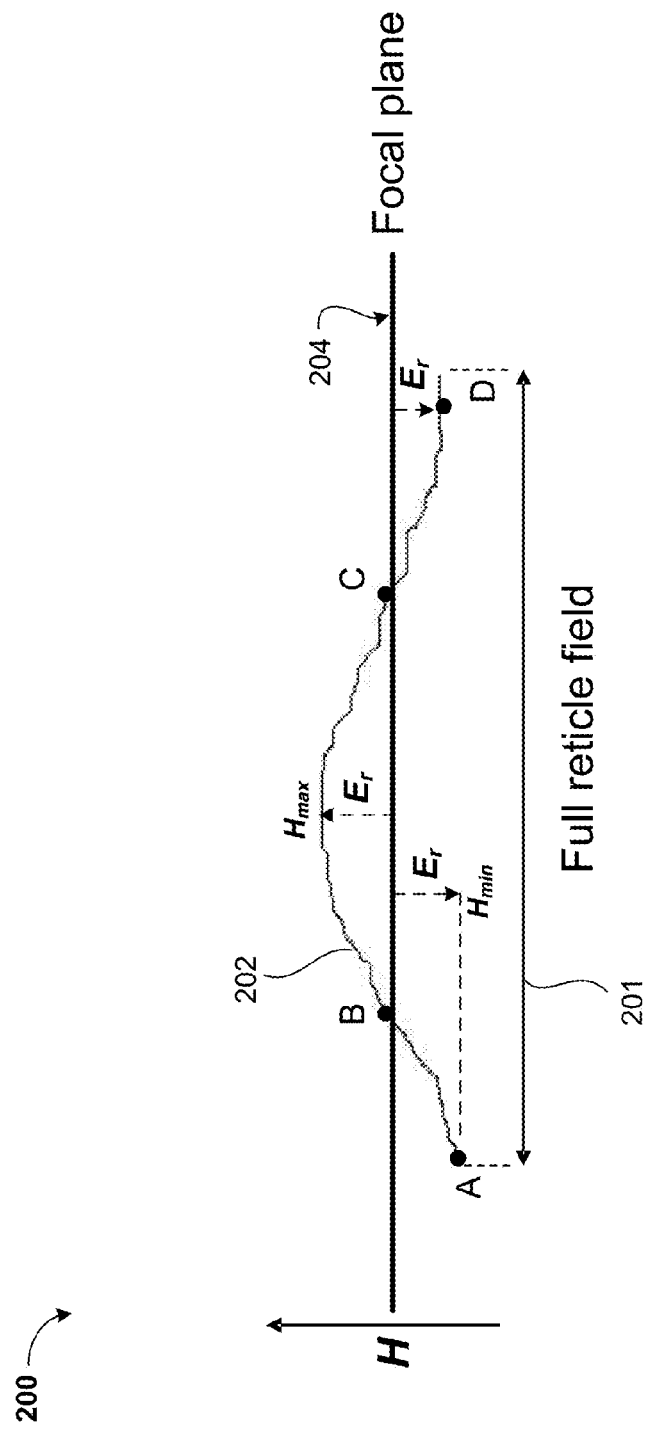
FIG. 2 is a focal plane selection graph representing a 2-dimensional (2D) topography corresponding to wafer height variations across a reticle field, according to one embodiment.

Thus, referring to FIG. 2, for illustrative clarity, the selection of a best-fit focal plane is illustrated in two-dimensions (2D). However, as illustrated and described in relation to FIG. 1B, the focal plane can continuously be rotated in 3D about axes H, $X_1$, and $X_2$, which may be orthogonal to $X_1$, to achieve the best possible instantaneous fit to the wafer topography. As depicted in FIG. 2, since the wafer surface, as indicated by 2D topography profile 202, is not flat across the slit, not all points across the slit can be in perfect focus. For example, point A and point B are at different heights (H). Similarly, point C and point D are at different heights. Also, points A and D are at substantially the same height, while points B and C are at substantially the same height. Thus, based on such the topography profile 202, a best fit focal plane 204 is accordingly selected. As depicted, the selected best-fit focal plane 204 is approximately in-focus with points B and C and out-of-focus with points A and D. However, the selected focal plane 204 may be set at the average of the maximum height $H_{max}$ and the minimum height $H_{min}$ of the 2D topography profile 202 to provide the best fit.

Existing modeling tools may be used to generate a 3D topography of a wafer surface within the reticle field based on, for example, BEOL CMP processes and reticle design data. An example of such a 3D topography is illustrated and described above in relation to FIG. 1A. During such a 3D modeling process, for example, a 30 mm by 30 mm reticle field (e.g., chip area) may be organized into 10 μm by 10 μm tiles. For example, each of the tiles (e.g., 101) within field 104 (FIG. 1A) may have an area of 10 μm by 10 μm. As depicted by the visual contrast legend 111, each tile includes a height value based on the irregular surface within the 30×30 mm reticle field. Within each region 107 of the slit 110, each of the height values associated with the tiles are utilized in order to generate a best-fit focal plane. This concept is described in 2D in FIG. 2. As depicted in FIG. 2, the best-fit focal plane 204 includes focus errors $E_r$ (i.e., non-correctable focus errors) relative to various points (e.g., A, D, etc.) across the wafer topography exposed through the slit 110 (FIG. 1A). However, according to the following embodiments, reticle data, which includes the design data associated with generating the conductive tracks on a given BEOL layer, may be processed in order to reduce the focus errors $E_r$ (i.e., non-correctable focus errors).

Figure 3:
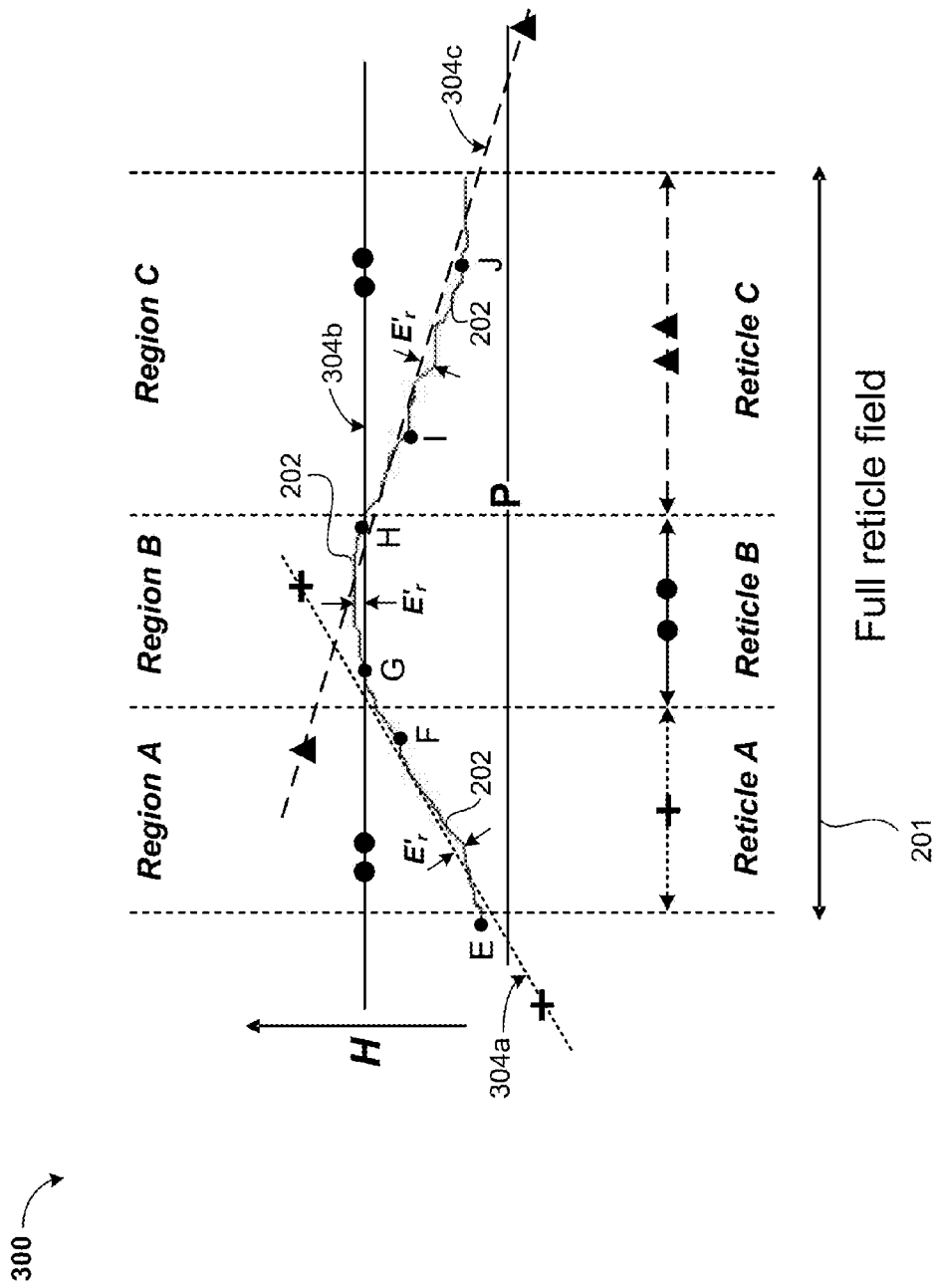
FIG. 3 is another focal plane selection graph representing a 2-dimensional (2D) topography corresponding to wafer height variations across a reticle field based on reticle data decomposition, according to one embodiment.

Referring to FIG. 3, for illustrative clarity, the selection of a best-fit focal plane according to one embodiment is also illustrated in two-dimensions (2D). However, as illustrated and described in relation to FIG. 1B, the focal plane can continuously be rotated in 3D about axes H, $X_1$, and $X_2$ to achieve the best possible instantaneous fit to the wafer topography as the slit 110 moves across the reticle field 104, as indicated by arrow 155. The height measured along axis H may be determined relative to a reference plane such as, for example, reference plane P. Also, as previously described axes $X_1$, and $X_2$ may be orthogonal with respect to each other.

As depicted in FIG. 3, since the wafer surface, as indicated by 2D topography profile 202, is not flat across the slit, not all points across the slit can be in perfect focus. For example, point E and point F are at different heights (H). Similarly, point I and point J are at different heights. Based on the topography profile 202, however, a plurality of best fit focal planes 304a, 304b, 304c may be accordingly selected in a manner that reduces the corresponding focus errors $E'_r$ (i.e., non-correctable focus error). As depicted, across the slit, the total reticle data may be divided into, for example, three non-overlapping data reticle subsets, Reticle A, Reticle B, and Reticle C. A non-overlapping data reticle subset may include a reticle subset which has design data that is unique to that subset and not shared with another reticle subset or subsets. For example, if reticle data is to be divided into two (2) reticle subsets, the generated first and second subsets may each include design data that does not appear in the other subset.

For Reticle A, which corresponds to the wafer topography 202 in Region A, best fit focal plane 304a is selected. As depicted, focal plane 304a substantially tracks the surface topography (e.g., points E & F) of Region A with a reduced focus error $E'_r$ relative to the focus error $E_r$ (FIG. 2) associated with focal plane 204 (FIG. 2). For Reticle B, which corresponds to the wafer topography 202 in Region B, best fit focal plane 304b is selected. As depicted, focal plane 304b substantially tracks the surface topography (e.g., points G & H) of Region B with a reduced focus error $E'_r$ relative to the focus error $E_r$ (FIG. 2) associated with focal plane 204 (FIG. 2). Also, for Reticle C, which corresponds to the wafer topography 202 in Region C, best fit focal plane 304c is selected. As depicted, focal plane 304c substantially tracks the surface topography (e.g., points I & J) of Region C with a reduced focus error $E'_r$ relative to the focus error $E_r$ (FIG. 2) associated with focal plane 204 (FIG. 2). Thus, as shown in FIG. 3, by dividing the wafer topography 202 across the reticle field 201 into a plurality of regions (i.e., Region A, Region B, and Region C) that each correspond to a portion of the reticle data, enhanced focus plane selection may be ascertainable.

Figure 4:
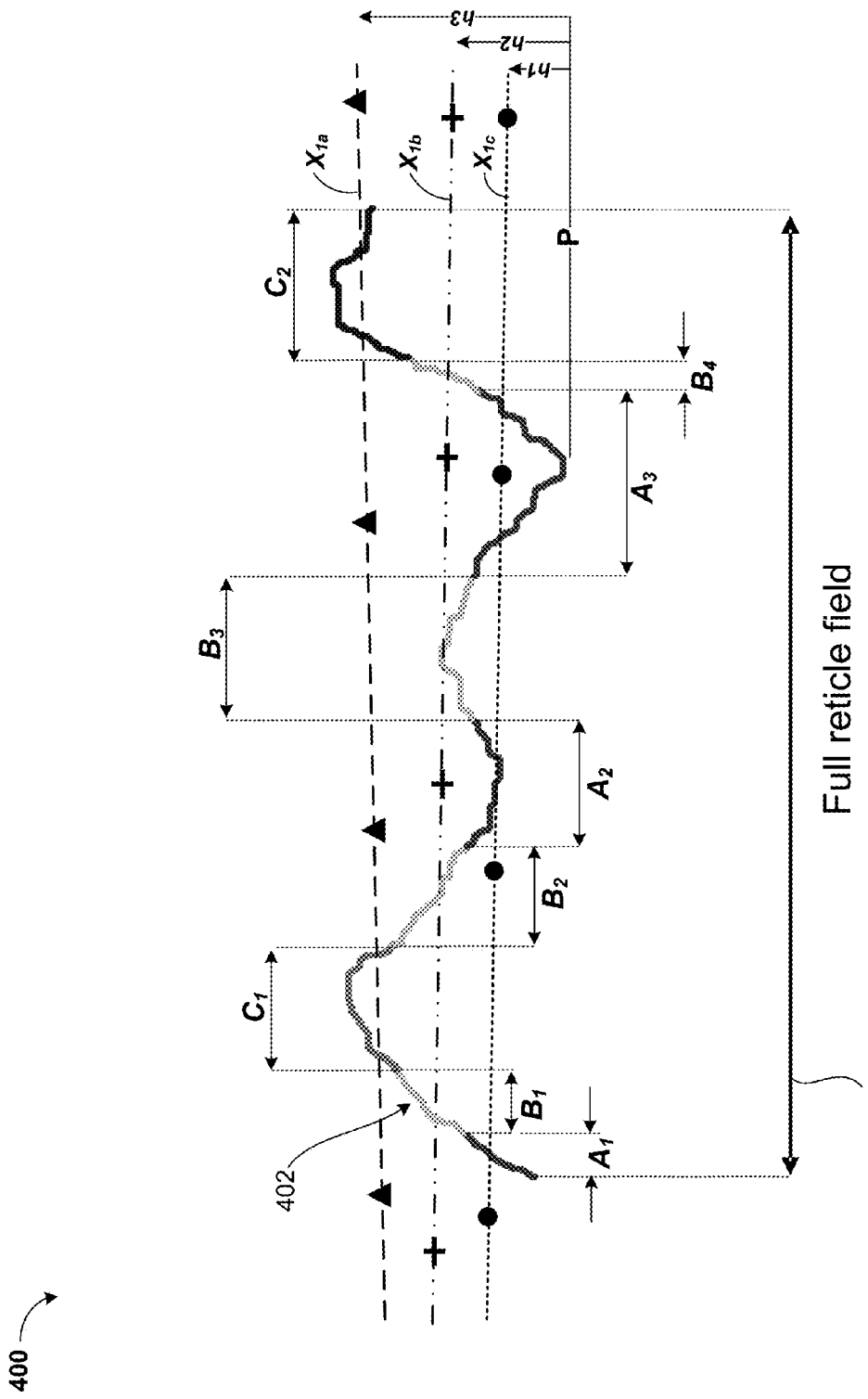
FIG. 4 is a focal plane selection and decomposed reticle data allocation graph for a 2-dimensional (2D) topography corresponding to wafer height variations across a reticle field, according to one embodiment.

Referring to FIG. 4, a distribution pattern 400 of reticle design data based on the topography 402 of the surface of the wafer 115 (FIG. 1B) for the purpose determining best fit focal planes is depicted. As illustrated, regions of the 2D topography profile 402 having similar topographies are determined. For example, based on the 2D topography profile 402, it may be determined that regions $A_1, A_2$, and $A_3$ of profile 402 have substantially similar topographies across the reticle field 401. Regions $C_1$ and $C_2$ along with regions $B_1, B_2, B_3$, and $B_4$ of profile 402 may also be determined to have substantially similar topographies across the reticle field 401.

Based on the determination of the three (3) topography regions (i.e., $A_1$-$A_3$, $B_1$-$B_4$, $C_1$-$C_2$), the reticle design data is also divided into three (3) subsets. Thus, a first reticle design data subset may correspond to design data that is present at regions $A_1, A_2$, and $A_3$ of profile 402. A second reticle design data subset may correspond to design data that is present at regions $B_1, B_2, B_3$, and $B_4$ of profile 402. The third reticle design data subset may accordingly correspond to design data that is present at regions $C_1$ and $C_2$ of profile 402. Once the reticle design data is divided into three (3) subsets and assigned to their corresponding topographical regions, a focal plane may be determined for each of the topography regions $A_1$-$A_3$, $B_1$-$B_4$, $C_1$-$C_2$. Specifically, as depicted, focal plane 404a provides a best fit, and is utilized for, exposing the first reticle design data subset corresponding to regions $A_1$-$A_3$ of profile 402. Also, focal plane 404b provides a best fit, and is utilized for, exposing the second reticle design data subset corresponding to regions $B_1$-$B_4$ of profile 402. Focal plane 404c accordingly provides a best fit, and is utilized for, exposing the third reticle design data subset corresponding to regions $C_1$-$C_2$ of profile 402. As depicted, each of the focal planes 404a, 404b, 404c are at different heights (h1-h3) relative to reference plane P and have different tilt angles ($X_{1a}$, $X_{1b}$), $X_{1c}$). As described in relation to FIG. 1B, the focal planes may vary in 3D and, therefore, may also include another tilt angle $X_2$ (FIG. 1B).

Figure 5:
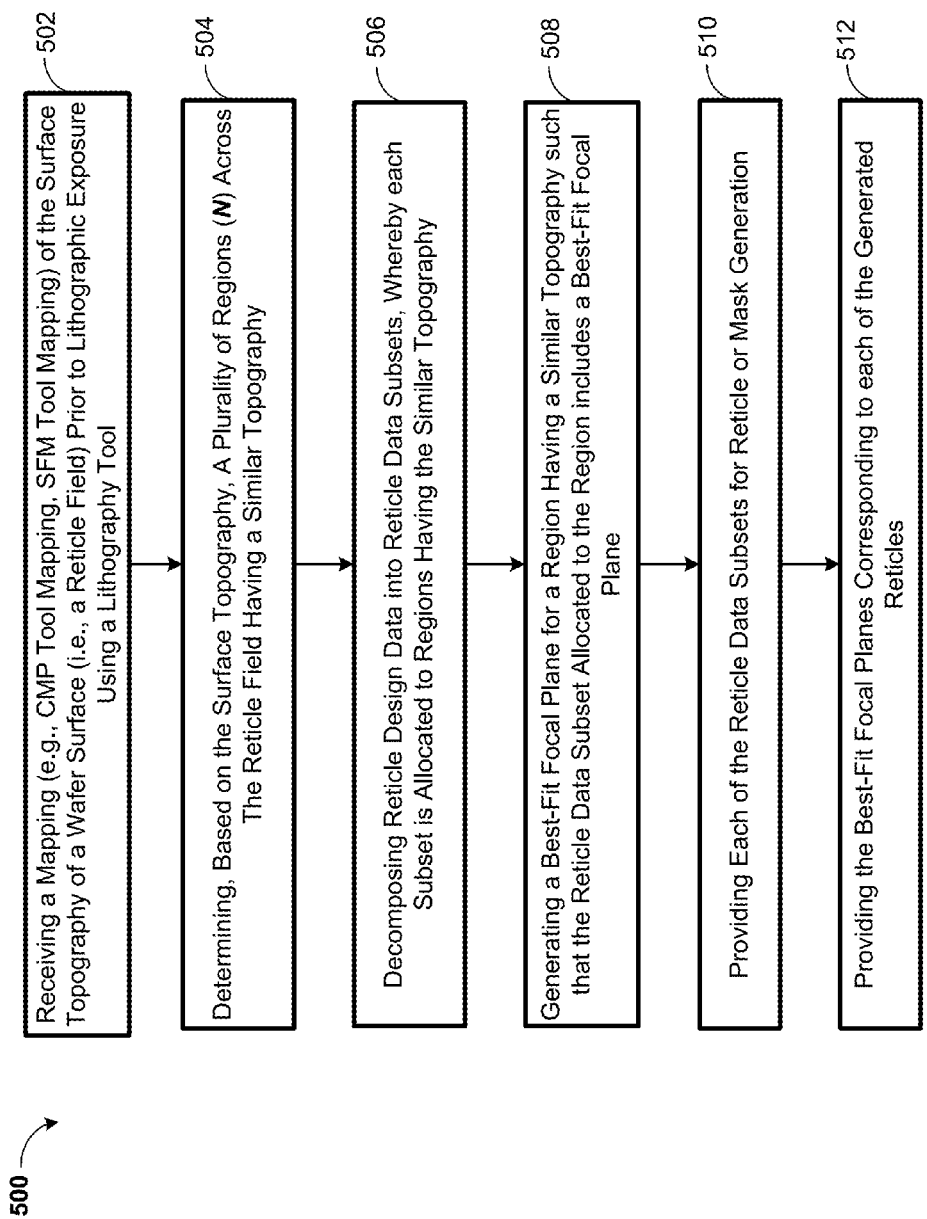
FIG. 5 is a flow diagram for a reticle data decomposition (RDD) process, according to one embodiment.
Figure 6:
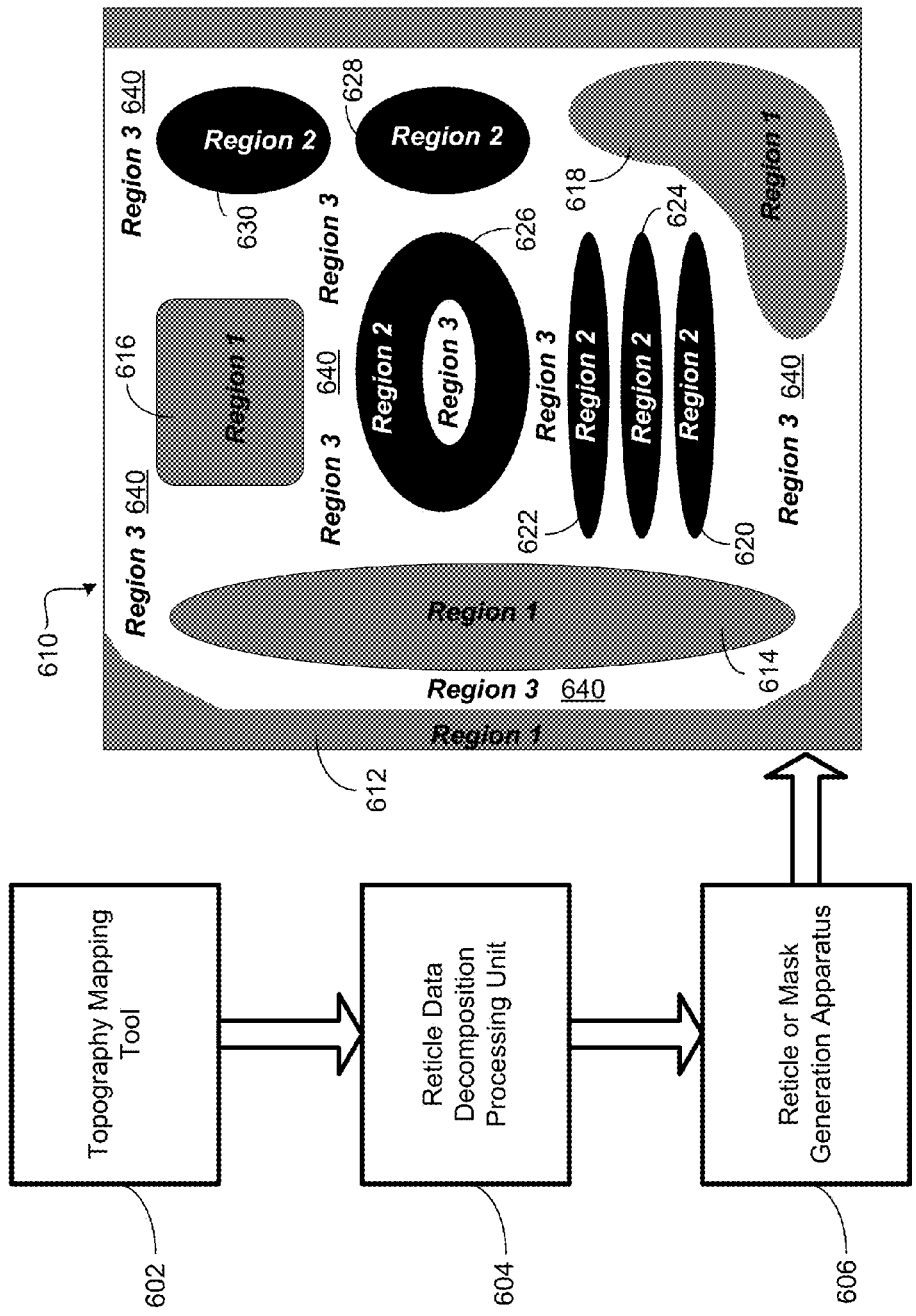
FIG. 6 is a system block diagram depicting one or more apparatuses for generating reticles according to the exemplary embodiment of the process of FIG. 6.

FIG. 5 refers to a flow diagram for a reticle data decomposition (RDD) process 500, according to one embodiment. The process of FIG. 5 is described with the aid of the lithographic system block diagram 600 depicted in FIG. 6. At 502, a mapping of the surface topography of a wafer surface prior to lithographic exposure is received for processing. The surface topography mapping (e.g., surface heights across reticle field) may be carried out using an interferometer tool following CMP or an atomic force microscope (SFM) scan tool. Generally, any modeling tool capable of mapping the surface topography of the wafer surface may be used. Referring to FIG. 6, for example, a topography mapping tool 602 such as an interferometer tool or an atomic force microscope (SFM) scan tool may generate the requisite surface topography mapping data for processing by the reticle data decomposition (RDD) processing unit 604. The reticle data decomposition (RDD) processing unit 604 may be implemented as software, firmware, hardware, or any combination thereof.

At 504, once the surface topography has been mapped (502), the mapped surface topography is divided into a plurality of regions that have a similar topography. For example, regions that have a similar topography may include those regions that include a height difference (Δh) within a predetermined range. One region (e.g., Region 1) may, for example, include heights (h) that vary between 134.0 μm and 134.5 μm. Thus, the height difference (Δh) is 0.5 μm (i.e., 134.5 μm-134.0 μm) over the predetermined range of about 134.0 μm to 134.5 μm. Another region (e.g., Region 2) may, for example, include heights (h) that vary between 134.0 μm and 133.5 μm. Thus, the height difference (Δh) is 0.5 μm (i.e., 134.0 μm-133.5 μm) over the predetermined range of about 133.5 μm to 134.0 μm. Also, another region (e.g., Region 3) may, for example, include heights (h) that vary between 133.5 μm and 133.0 μm. Thus, the height difference (Δh) is 0.5 μm (i.e., 133.5 μm-133.0 μm) over the predetermined range of about 133.0 μm to 133.5 μm.

At 506, the reticle design data is decomposed or split into a number reticle data subsets corresponding to the number of plurality of regions determined at 504. For example, if three regions (e.g., Regions 1, 2, and 3) are determined (504), the reticle design data is decomposed or split into a number of reticle data subsets (e.g., Reticle Data Subsets 1, 2, and 3), each allocated to a respective one of the three regions (e.g., Regions 1, 2, and 3). Particularly, Reticle Data Subset 1 may be allocated to Region 1, Reticle Data Subset 2 may be allocated to Region 2, and Reticle Data Subset 3 may accordingly be allocated to Region 3. Referring to FIG. 6, for example, once the requisite surface topography mapping data is received by the reticle data decomposition (RDD) processing unit 604, the RDD processing unit 604 may divide the mapped surface topography into a plurality of regions having a similar topography such as Region 1, Region 2, and Region 3. The RDD processing unit 604 may then allocate the split reticle design data to each of the Region 1, Region 2, and Region 3.

Referring to FIG. 6, as depicted in the plan view of the wafer surface 610, for example, a first portion of Reticle Data Subset 1 corresponding to wafer surface locations corresponding to Region 1 is allocated to area 612. Also, a second portion of the Reticle Data Subset 1 corresponding to wafer surface locations corresponding to Region 1 is allocated to area 614. A third portion of the Reticle Data Subset 1 corresponding to wafer surface locations corresponding to Region 1 is allocated to area 616. Finally, a fourth portion of the Reticle Data Subset 1 corresponding to wafer surface locations corresponding to Region 1 is allocated to area 618. Thus, since Region 1 includes areas 612-618 having a substantially similar topography, Reticle Data Subset 1 is accordingly allocated among the corresponding areas 612-618 of Region 1.

Further referring to FIG. 6, as depicted in the plan view of the wafer surface 610, for example, a first portion of Reticle Data Subset 2 corresponding to wafer surface locations corresponding to Region 2 is allocated to area 620. Also, a second portion of the Reticle Data Subset 2 corresponding to wafer surface locations corresponding to Region 2 is allocated to area 622. A third portion of the Reticle Data Subset 2 corresponding to wafer surface locations corresponding to Region 2 is allocated to area 624. A fourth portion of the Reticle Data Subset 2 corresponding to wafer surface locations corresponding to Region 2 is allocated to area 626, while a fifth portion of the Reticle Data Subset 2 corresponding to wafer surface locations corresponding to Region 2 is allocated to area 628. Finally, a sixth portion of the Reticle Data Subset 2 corresponding to wafer surface locations corresponding to Region 2 is allocated to area 630. Thus, since Region 2 includes areas 620-630 having a substantially similar topography, Reticle Data Subset 2 is accordingly allocated among the corresponding areas 620-630 of Region 2.

Referring to FIG. 6, as further depicted in the plan view of the wafer surface 610, for example, Reticle Data Subset 3 corresponding to wafer surface locations corresponding to Region 3 is allocated to areas 640.

Referring back to FIG. 5, at 508, a best fit focal plane is determined for each of topography Region 1, Region 2, and Region 3. As described and illustrated above in relation to FIGS. 3 and 4, the non-correctable focal plane errors (e.g., FIG. 3: $E'_r$) relative to the wafer topography are reduced by allocating the reticle design data to two or more predetermined regions on the wafer surface. Thus, Reticle Data Subset 1 includes a first focal plane, Reticle Data Subset 2 includes a second focal plane, and Reticle Data Subset 3 includes a third focal plane.

At 510, for each Reticle Data Subset, a corresponding mask or reticle is created. For example, referring to FIG. 6, for Reticle Data Subset 1, a first mask or reticle that includes Region 1 is generated, whereby the mask or reticle would have mask shapes governed by areas 612-618. Particularly, the regions of the first reticle not included by areas 612-618 may have a chrome surface. Also, for Reticle Data Subset 2, a second mask or reticle that includes Region 2 is generated, whereby the mask or reticle would have mask shapes governed by areas 620-630. Particularly, the regions of the second reticle not included by areas 620-630 may include a chrome surface. Further, for Reticle Data Subset 3, a third mask or reticle that includes Region 3 is generated, whereby the mask or reticle would have mask shapes governed by areas 640. Particularly, the regions of the third reticle not included by areas 640 may have a chrome surface.

At 512, during a lithographic process, each reticle and its corresponding best fit focal plane are utilized. For example, referring to FIG. 6, a reticle or mask generation apparatus 606 may be utilized to create the first, second, and third reticles associated with Reticle Data Subsets 1, 2, and 3, respectively. Thus, in operation, the lithography tool 150 (FIGS. 1B, 6) may expose each reticle with its corresponding average focal plane within each exposure plane. In operation, the lithography tool 150 (FIG. 1B) may expose each reticle with a completely different focusing scheme, such that for each of the several reticles, the focal plane is continuously varied during the exposure scan (i.e., rotated about axes $X_1$, $X_2$, and height H as depicted in FIG. 1B) in a manner unique from the other reticles. The focal plane motions during wafer field exposure with a particular reticle undergo the best average focus only for those areas which have design data on that particular reticle, and not for the chrome areas on that particular reticle. The lithography tool software may, for example, be accordingly programmed to ignore, during exposure with a particular reticle, the previously measured topography of the wafer field which corresponds to the chrome areas on that particular reticle. Particularly, the topography in those areas (i.e., chrome areas) will have no bearing on the focal plane movements for that particular reticle's exposure scan. Thus, the areas in the reticle field on any particular reticle which has design data (non-chrome areas) will have a better average focus (or smaller average focus error) than if those areas had been exposed with a single reticle scheme. Since each of the several reticles will produce a smaller average focus error for their respective field areas having design data (non-chrome areas), the overall average focus error for the entire field as exposed with the several different reticles will be smaller than if the entire field had been exposed with a single reticle scheme.

By determining more regions of the wafer surface having a similar topography, the reduction in the non-correctable errors associated with determining a best-fit focal plane may be further decreased. In the current embodiment, three (3) regions (i.e., Regions 1-3) are illustrated for exemplary non-limiting purposes. However, the surface topography may include any number of determined regions. The more regions having similar topographies included, the less the non-correctable errors. However, more reticle data splitting or decomposition processing may be required. Additionally, more reticle or masks may be used during lithography. Thus, if enhancement of focal plane accuracy is of importance, more reticle data subsets and reticles may be utilized. Alternatively, if reticle data processing overhead and lithography process times are of some concern, thus, less reticle data subsets and reticles may be implemented.

The above described reticle data split or decomposition may be accomplished in a 3D process. A CMP model may be used to predict the surface topography and the modeling output (i.e., prediction of wafer surface height above some reference plane) may then be used to predict the non-correctable focus error across the reticle field. As described a software program such as reticle data decomposition (RDD) process 500 (FIG. 5) may be employed to split the reticle data into reticle data subsets corresponding to two, three, or more, reticles, such that the overall average non-correctable focus error is minimized. The reticles may, therefore, be fabricated based on the split boundaries. For example, the data splitting can be done with a via level or with a line level. If a via falls on a split boundary, it may be determined to place the via on one reticle or another, and similarly with a small line segment. Thus, long lines which cross the split boundaries may be stitched.

Figure 7:
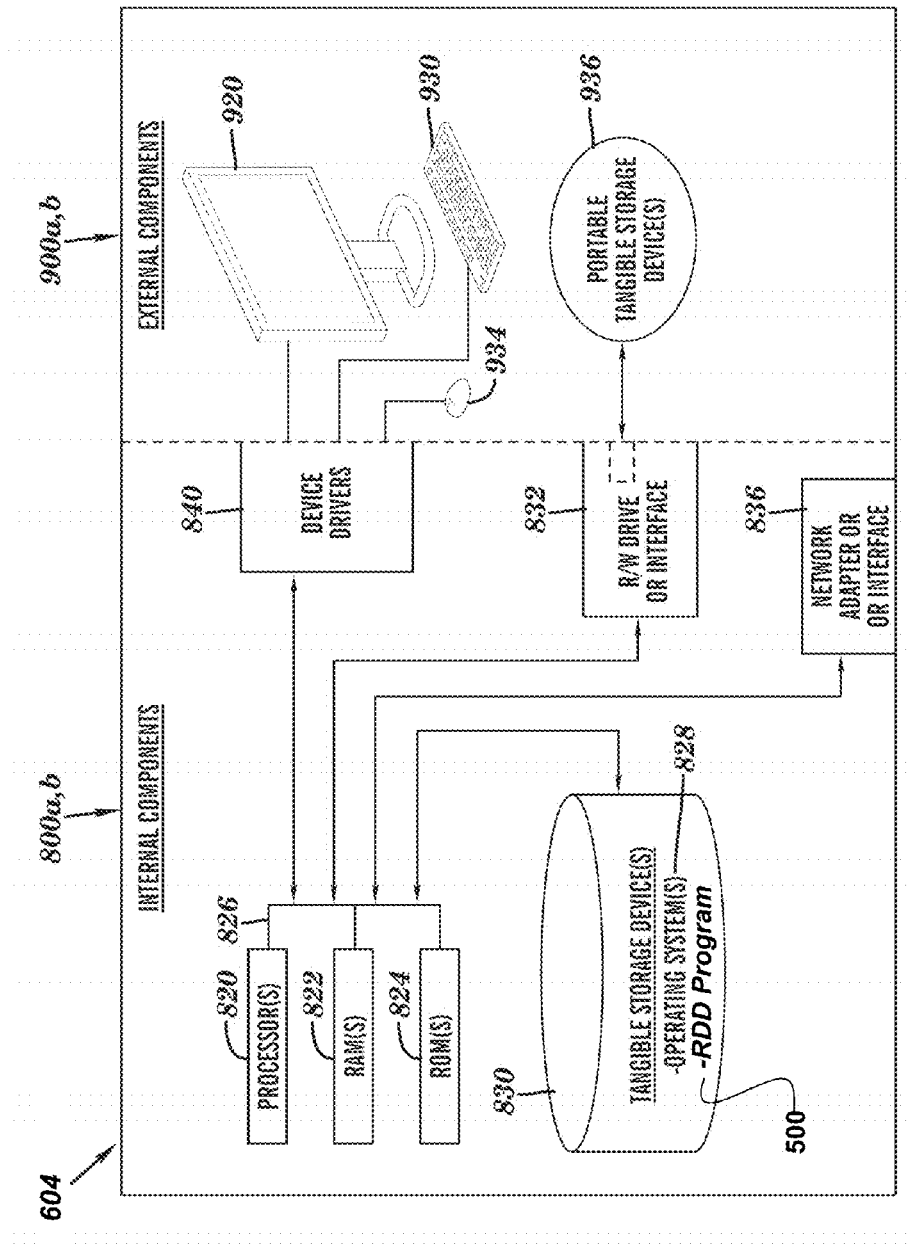
FIG. 7 is a flow diagram corresponding to a process of creating the exemplary aberration monitor embodiments.

FIG. 7 shows a block diagram of the components of a data processing system 800, 900, such as reticle data decomposition unit 604 (FIG. 6) in accordance with an illustrative embodiment of the present invention. It should be appreciated that FIG. 7 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Reticle data decomposition unit 604 (FIG. 6) may include respective sets of internal components 800 a, b, c and external components 900 a, b, c illustrated in FIG. 4. Each of the sets of internal components 800 a, b, c includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs such as the RDD program 500 (FIG. 5) corresponding to reticle data decomposition unit 604 (FIG. 6) is stored on one or more computer-readable tangible storage devices 830 for execution by one or more processors 820 via one or more RAMs 822 (which typically include cache memory). In the embodiment illustrated in FIG. 7, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800 a, b, c also includes a R/W drive or interface 832 to read from and write to one or more portable computer-readable tangible storage devices 936 such as a CD-ROM, DVD, memory stick, magnetic tape, magnetic disk, optical disk or semiconductor storage device. The RDD program 500 (FIG. 5) associated with reticle data decomposition unit 604 (FIG. 6) can be stored on one or more of the respective portable computer-readable tangible storage devices 936, read via the respective R/W drive or interface 832 and loaded into the respective hard drive 830.

Each set of internal components 800a, b, c may also include network adapters (or switch port cards) or interfaces 836 such as a TCP/IP adapter cards, wireless wi-fi interface cards, or 3G or 4G wireless interface cards or other wired or wireless communication links. RDD program 500 (FIG. 5), in reticle data decomposition unit 604 (FIG. 6), can be downloaded to reticle data decomposition unit 604 (FIG. 6) from an external computer (e.g., server) via a network (for example, the Internet, a local area network or other, wide area network) and respective network adapters or interfaces 836. From the network adapters (or switch port adaptors) or interfaces 836, the RDD program 500 (FIG. 5) associated with reticle data decomposition unit 604 (FIG. 6) is loaded into the respective hard drive 830. The network may comprise copper wires, optical fibers, wireless transmission, routers, firewalls, switches, gateway computers and/or edge servers.

Each of the sets of external components 900 a, b, c can include a computer display monitor 920, a keyboard 930, and a computer mouse 934. External components 900 a, b, c can also include touch screens, virtual keyboards, touch pads, pointing devices, and other human interface devices. Each of the sets of internal components 800 a, b, c also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of determining focal planes during a photolithographic exposure of a wafer surface, the method comprising:
   receiving, from a topography mapping tool, data corresponding to a surface topography of the wafer surface;
   determining by a processing unit, based on the received data corresponding to the surface topography, a plurality of regions of the wafer surface that each comprise a substantially different topography height range having a substantially the same topography height difference;
   receiving, by the processing unit, reticle design data for exposure on the wafer surface;
   generating, by the processing unit from the received reticle design data, reticle design data subsets that are each located within a corresponding one of the determined plurality of regions of the wafer surface;
   determining a best fit focal plane for each of the determined plurality of regions; and
   exposing the wafer surface with a plurality of reticles that each include a corresponding one of the generated reticle design data subsets located within the corresponding one of the determined plurality of regions, wherein each of the plurality of reticles operates using the best fit focal plane for the corresponding one of the determined plurality of regions.

2. The method of claim 1, wherein the determined best fit focal plane for each of the determined plurality of regions includes a non-correctable error relative to a surface topography of the wafer surface that reduces based on an increase in the number of the determined plurality of regions.

3. The method of claim 1, wherein the received data corresponding to the surface topography of the wafer surface includes one of utilizing an interferometry tool to determined the surface topography of the wafer surface and utilizing an atomic force microscope (AFM) tool to determine the surface topography of the wafer surface.

4. The method of claim 1, wherein the substantially different topographies comprises including different heights relative to a reference plane.

5. The method of claim 1, wherein, during lithography, the best fit focal plane for each of the determined plurality of regions is varied in three-dimensions according to height, a first tilt axis, and a second tilt axis orthogonal to the first tilt axis, and wherein the best fit focal plane for each of the determined plurality of regions is determined based on a topography area corresponding to each of the respective reticle design data subsets.

6. The method of claim 1,
   wherein the plurality of regions comprise a first region having a first predetermined surface topography height range and a second region having a second predetermined surface topography height range,
   and wherein the reticle design data subsets comprise a first reticle design data subset located within the first region having the first predetermined surface topography height range and a second reticle design data subset located within the second region having the second predetermined surface topography height range,
   and wherein the best fit focal plane for each of the determined plurality of regions comprises a first best fit focal plane corresponding to the first region having the first predetermined surface topography height range and a second best fit focal plane corresponding to the second region having the second predetermined surface topography height range, and wherein the plurality of reticles comprise a first reticle that includes the first reticle design data subset for exposing the first region having the first predetermined surface topography height range using the first best fit focal plane and a second reticle that includes the second reticle design data subset for exposing the second region having the second predetermined surface topography height range using the second best fit focal plane, wherein the first and the second reticle generate a lower non-correctable focal plane error relative to a single reticle that includes both the first reticle design data subset and the second reticle design data subset.

7. A computer program product for determining focal planes during a photolithographic exposure of a wafer surface, the computer program product comprising a non-transitory computer readable storage medium readable by a processing circuit and storing instructions for execution by the processing circuit for performing a method comprising:
receiving data corresponding to a surface topography of the wafer surface;
determining, based on the received data corresponding to the surface topography, a plurality of regions of the wafer surface that each comprise a substantially different topography height range having a substantially the same topography height difference;
receiving reticle design data for exposure on the wafer surface;
generating, from the received reticle design data, reticle design data subsets that are each located within a corresponding one of the determined plurality of regions; and
determining a best fit focal plane for each of the determined plurality of regions,
wherein the wafer surface is exposed with a plurality of reticles that each include a corresponding one of the generated reticle design data subsets located within the corresponding one of the determined plurality of regions, wherein each of the plurality of reticles operates using the best fit focal plane for the corresponding one of the determined plurality of regions.

8. The computer program product of claim 7, wherein the determined best fit focal plane for each of the determined plurality of regions includes a non-correctable error relative to a surface topography of the wafer surface that reduces based on an increase in the number of the determined plurality of regions.

9. The computer program product of claim 7, wherein the received data corresponding to the surface topography of the wafer surface includes utilizing an interferometry tool to determined the surface topography of the wafer surface.

10. The computer program product of claim 7, wherein the received data corresponding to the surface topography of the wafer surface includes utilizing an atomic force microscope (AFM) tool to determine the surface topography of the wafer surface.

11. The computer program product of claim 7, wherein the best fit focal plane for each of the determined plurality of regions is varied in three-dimensions according to height, a first tilt axis, and a second tilt axis orthogonal to the first tilt axis, and wherein the best fit focal plane for each of the determined plurality of regions is determined based on a topography area corresponding to each of the respective reticle design data subsets.

12. The computer program product of claim 7, wherein the substantially different topographies comprises including different heights relative to a reference plane.

13. The computer program product of claim 7,
wherein the plurality of regions comprise a first region having a first predetermined surface topography height range and a second region having a second predetermined surface topography height range,
and wherein the reticle design data subsets comprise a first reticle design data subset located within the first region having the first predetermined surface topography height range and a second reticle design data subset located within the second region having the second predetermined surface topography height range,
and wherein the best fit focal plane for each of the determined plurality of regions comprises a first best fit focal plane corresponding to the first region having the first predetermined surface topography height range and a second best fit focal plane corresponding to the second region having the second predetermined surface topography height range,
and wherein the plurality of reticles comprise a first reticle that includes the first reticle design data subset for exposing the first region having the first predetermined surface topography height range using the first best fit focal plane and a second reticle that includes the second reticle design data subset for exposing the second region having the second predetermined surface topography height range using the second best fit focal plane, wherein the first and the second reticle generate a lower non-correctable focal plane error relative to a single reticle that includes both the first reticle design data subset and the second reticle design data subset.

14. A computer system for determining focal planes during a photolithographic exposure of a wafer surface comprising:
a memory;
a processor in communication with the memory, the processor comprising an instruction fetching unit for fetching instructions from memory and one or more execution units for executing fetched instructions;
wherein said computer system performs a method comprising:
receiving data corresponding to a surface topography of the wafer surface;
determining, based on the received data corresponding to the surface topography, a plurality of regions of the wafer surface that each comprise a substantially different topography height range having a substantially the same topography height difference;
receiving reticle design data for exposure on the wafer surface;
generating, from the received reticle design data, reticle design data subsets that are each located within a corresponding one of the determined plurality of regions; and
determining a best fit focal plane for each of the determined plurality of regions,
wherein the wafer surface is exposed with a plurality of reticles that each include a corresponding one of the generated reticle design data subsets located within the corresponding one of the determined plurality of regions, wherein each of the plurality of reticles operates using the best fit focal plane for the corresponding one of the determined plurality of regions.

15. The computer system of claim 14, wherein the determined best fit focal plane for each of the determined plurality of regions includes a non-correctable error relative to a surface topography of the wafer surface that reduces based on an increase in the number of the determined plurality of regions.

16. The computer system of claim 14, wherein the best fit focal plane for each of the determined plurality of regions is varied in three-dimensions according to height, a first tilt axis, and a second tilt axis orthogonal to the first tilt axis, and wherein the best fit focal plane for each of the determined plurality of regions is determined based on a topography area corresponding to each of the respective reticle design data subsets.

17. The computer system of claim 14,
wherein the plurality of regions comprise a first region having a first predetermined surface topography height range and a second region having a second predetermined surface topography height range,
and wherein the reticle design data subsets comprise a first reticle design data subset located within the first region having the first predetermined surface topography height range and a second reticle design data subset located within the second region having the second predetermined surface topography height range,
and wherein the best fit focal plane for each of the determined plurality of regions comprises a first best fit focal plane corresponding to the first region having the first predetermined surface topography height range and a second best fit focal plane corresponding to the second region having the second predetermined surface topography height range,
and wherein the plurality of reticles comprise a first reticle that includes the first reticle design data subset for exposing the first region having the first predetermined surface topography height range using the first best fit focal plane and a second reticle that includes the second reticle design data subset for exposing the second region having the second predetermined surface topography height range using the second best fit focal plane, wherein the first and the second reticle generate a lower non-correctable focal plane error relative to a single reticle that includes both the first reticle design data subset and the second reticle design data subset.

* * * * *